United States Patent [19]

Bohg et al.

[11] 4,158,072

[45] Jun. 12, 1979

[54] METHOD FOR MAKING CONNECTIONS BETWEEN CONTACTS

[75] Inventors: Armin Bohg, Ehningen; Marian Briska; Bernd Garben, both of Böblingen, all of Fed. Rep. of Germany

[73] Assignee: International Business Machines Corporation, Armonk, N.Y.

[21] Appl. No.: 804,676

[22] Filed: Jun. 8, 1977

[30] Foreign Application Priority Data

Jul. 20, 1976 [DE] Fed. Rep. of Germany ....... 2632548

[51] Int. Cl.$^2$ .................. B05D 5/12; B41M 3/08; H05K 1/04; H05K 3/00
[52] U.S. Cl. ........................................ 427/43; 427/53; 427/96; 427/99; 427/259; 427/264; 427/272; 340/166 R; 29/574; 96/36.2; 156/659
[58] Field of Search .................. 427/96, 272, 43, 53, 427/99, 259, 264; 340/176, 166 R, 173 BB; 235/153 A; 29/574; 96/36.2; 156/659

[56] References Cited

U.S. PATENT DOCUMENTS

| | | | |
|---|---|---|---|
| 3,423,822 | 1/1969 | Davidson | 29/577 |
| 3,633,268 | 1/1972 | Engbert | 29/574 |

Primary Examiner—Michael F. Esposito
Assistant Examiner—Richard Bueker
Attorney, Agent, or Firm—Howard J. Walter, Jr.

[57] ABSTRACT

A technique for providing interconnections between pairs of contact points associated with a conductive line pattern by the use of an interconnection defining tool which is selectively alignable with respect to the conductive line. The conductive line pattern comprises at least one conductive line which is either continuous or shows interruptions, and from which lines branch off to the contact points. The tool is adapted to the conductive line and consists of a row of elements, the distance between which is dimensionally related to the distance between the branch-offs. After the tool has been adjusted to the conductive line in accordance with the respective connections, the elements of the tool are used for interrupting or connecting the conductive line at predetermined positions. If a radiation mask is used as a tool, the elements of the tool consist of areas which differ from their surroundings in their radiation transparency, and the conductive line pattern may exist as a latent image on a substrate covered by a photoresist layer sensitive to radiation. The invention serves to provide, in a circuit arrangement with redundant elements, a single circuit, the final wiring of which excludes one or several defective redundant circuit elements.

12 Claims, 16 Drawing Figures

METHOD FOR MAKING CONNECTIONS BETWEEN CONTACTS

BACKGROUND OF THE INVENTION

1. Field of the Invention

This invention relates to a method for making separate connections between a plurality of circuit contacts, including at least one contact which is to be excluded from a completed circuit.

2. The Prior Art

If several similar parts of a circuit are made together as a unit and if they are then tested, the entire circuit arrangement will be useless if the test shows that one part of the circuit does not work. This problem appears in integrated solid state memories, the manufacture of which requires hundreds or thousands of identical storage cells with a corresponding amount of components, such as transistors, diodes, and resistors all produced simultaneously in a semiconductor substrate. The problem can be solved, or at least reduced, if one or several surplus parts of a circuit are made, so that the final connecting of the circuit arrangement, i.e. the providing of separate connections between the contacts belonging to the parts of the circuit, electric supply lines, etc., takes place after the parts of the circuits have been tested. In this manner defective parts of the circuit can be excluded and only intact parts included in the circuit arrangement.

Prior art processes are known which follow this principle. U.S. Pat. No. 3,553,830, for instance, describes a process where undesired line connections are destroyed by short pulses of high electric currents. However, this process can only be applied when much space is available for specific large area current supplies which practically always is undesirable. In U.S. Pat. No. 3,771,217 a process is described where, on the basis of test results and a computer program, a unique pattern is established by means of a controlled light beam used to expose a negative photoresist which covers a layer of conductive line material on the circuit arrangement. After the development of the photoresist layer, which leaves the exposed areas in place, the non-masked conductive line material is etched off, and there remains a conductive line pattern which is connected to functioning parts of the circuit only. This process is highly time-consuming and involves expensive apparatus because an entire mask must be generated for each complete circuit combination.

SUMMARY OF THE INVENTION

It is therefore the object of the invention to permit the making of separate connections between fixed contacts, excluding at least one contact, and to provide for that purpose a process so that the production is possible simply, quickly, and with the use of conventional apparatus and process steps, presenting perfect connections of long life time and low space requirements.

A latent conductive line pattern, a pattern which is produced by means of radiation through a mask in a radiation-sensitive photoresist, is utilized. The conductive line pattern is of simple design and contains, apart from the lines to the contacts to be excluded, only such lines that are required for the operation of the circuit arrangement. According to the test results, a tool matching the conductive line pattern permits the production of a large number, and in many cases, even of all of the desired separate connections between those contact points that are connected to the lines via adjacent branchings. Quite generally, any such tool is suitable for executing the invention which can be combined with identical parts of a tool which, depending on the substance characteristics and dimensions of the conductive line pattern, are suitable for separating or, in certain instances, for connecting the conductive lines. Owing to the uncomplicated design of the arrangement as disclosed herein, the process can easily be automated.

If two or more surplus parts of a circuit are provided in the circuit arrangement, two or more contacts can be advantageously isolated if at least two conductive lines form a network together with the branching-off lines, the lines branching off alternatingly from two outer conductive lines directly to contact points and to the adjacent, i.e. the next conductive line, and from all other conductive lines that may be provided alternatingly to the two adjacent conductive lines.

It is particularly advantageous if all branching lines have approximately the same spacing from adjacent branching lines. In such a case, if there are two or more surplus parts of a circuit, one tool will suffice.

If it is desirable to make separate connections between two or more contact points, and also to isolate contact points, the method of the invention can be carried out advantageously if the conductive line pattern is of such a design that it contains at least two conductive lines and some of the contact points are directly connected to each one of these conductive lines such that all contact points are directly connected to one respective conductive line only, and that additional lines are alternatingly provided between contact positions which are connected to both of the conductive lines.

If the testing of parts of a circuit is to take place by means of an electric test, it may be an advantage when the conductive line is continuous such that the tool is used for producing interruptions.

The arrangement as disclosed by the invention can also be advantageously used when the conductive line shows interruptions and when the tool is applied for bridging interruptions.

For better handling of the tool as disclosed by the invention, it may be advantageous to provide fiducial alignment masks on both the tool and the support, in such a manner that in each operating position of the tool its fiducial points coincide with two fiducial points on the conductive line pattern.

Depending on the particular conductive line pattern and the available tool handling equipment, different designs of the tool as disclosed by the invention can be imagined. If the conductive pattern is provided at least latently on a support or substrate which has as its top layer an undeveloped layer of a radiation-sensitive photoresist, it is of particular advantage if the tool is a radiation mask and if the operative elements of the tool are zones differing from their ambience in their radiation transparency. With present-day technology, radiation masks can be made with maximum precision for microminiaturized circuits of great complexity and high density. At the same time, however, radiation masks are also suitable for the processing of macroscopic conductive line patterns. Radiation masks and radiation-sensitive photoresists are used in lithographic processes which apart from their precision have the additional advantage in that their use does not require conductive line pattern to be exposed to any mechanical or high thermal stress.

The described technique, although easy to implement is adaptable to highly different conductive line patterns and tools. It can be applied for the sorting out of two or more surplus parts of a circuit, and may also be used in cases where contacts are to be connected by fixed separate lines with several contacts each. For most applications only one tool is required. In exceptional cases due to circuit design problems, only a few tools and one, or very few, alignment operations are sufficient allowing the process to be executed simply and time-savingly.

When carrying out the process using a mask as the tool, many variations are possible. The process can, for instance, be advantageously carried out by employing a conductive line pattern with at least one conductive line having interruptions between the branching lines, consisting of the conductive line material, and by irradiating said pattern through a mask in such a manner that the photoresist areas over the interruptions to be closed are removable after development of the photoresist, conductive material may be deposited over the photoresist to connect interrupted lines. By using a conductive line pattern with at least one continuous conductive line and irradiating it through a mask which is adapted to the photoresist in such a manner that in the places where interruptions are to be made the photoresist areas are removable after development of the photoresist, the lines may be interrupted by etching. By starting with a conductive line pattern which exists as a latent image in a negative photoresist applied on non-conductive substrate material, after the negative photoresist layer has been irradiated through a first mask which defines a conductive line pattern image by having continuous conductive lines not transparent to radiation, and subsequently irradiatiomg the exposed but undeveloped negative photoresist through a mask serving as a tool with its parts consisting of areas transparent to radiation, additional areas of the photoresist defined by the tool will provide interruptions. By assuming a conductive line pattern which exists as a latent image, in an exposed but undeveloped, positive layer applied on a continuous layer of conductive line material on a substrate, after the photoresist layer has been irradiated through a first mask which represents the conductive line pattern with continuous lines transparent to radiation, subsequent irradiation through a mask serving as a tool where the parts of the tool consist of radiation-transparent areas will provide removal of additional blocking photoresist, which, upon subsequent etching through the developed photoresist, will provide interruptions in the conductive line material.

It can also be of advantage in the two latter cases to alter the process to the effect that a conductive line pattern with interrupted conductive lines is assumed which exists merely latently in the photoresist layer and where as a tool a mask is used which bridges interruptions in the conductive lines, the photoresist used having to be negative when it has been applied on a layer of conductive line material, and positive if applied directly on a non-conductive substrate material.

The foregoing and other objects, features and advantages of the invention will be apparent from the more particular description of the preferred embodiments of the invention, as illustrated in the accompanying drawings.

DESCRIPTION OF THE PREFERRED EMBODIMENTS

Although the invention may be practiced in various different environments, the invention as described here permits the selective connection of decoder circuit output lines to the input lines of storage locations in integrated solid state memories.

The conductive line patterns can, for instance, consist of metal wires or be made by means of a paste containing a conductive line material wherein the conductive line pattern is screen-printed onto a substrate through a mask onto the substrate, or by initially providing the pattern of the conductive line material on the substrate, by using lithographic methods, by means of electroless metal plating, vapor-depositing, or similar processes. It is, however, equally possible that the conductive line pattern exists initially only as a latent image in a layer on the substrate which consists of a radiation-sensitive photoresist.

The substrates can, for instance, consist of plastics, ceramic material, or, as preferred herein, of a semiconductor device which is covered with at least one passivation layer having contact holes to underlying semiconductor circuitry as defined by metallization layers provided deeper in the structure.

The selection of the proper tools for carrying out the process as disclosed by the invention mainly depends on the substance, the design, and the dimensions of the conductive line pattern. Further reference thereto is made in detail below.

Figure 1A:
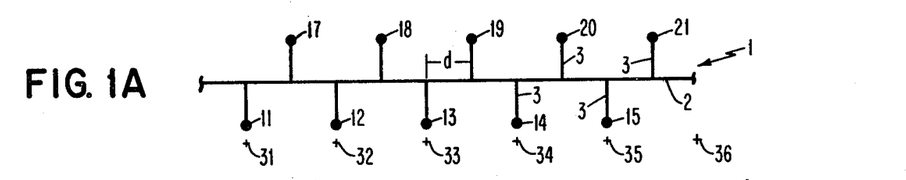
FIGS. 1A to 1D are a schematic representation of the making of selective conductive connections between respective contacts, all initially connected to a common line, including the isolation of a contact in accordance with the invention in that, as shown by FIG. 1C, the tool repesented in FIG. 1B is horizontally aligned over the conductive line pattern of FIG. 1A, and that subsequently the conductive line is repeatedly interrupted so that the pattern of FIG. 1D is formed.
Figure 1B:
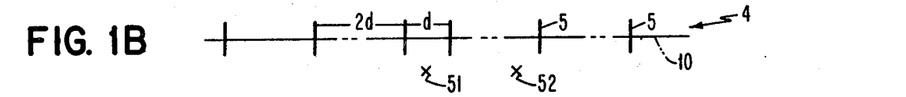
Figure 1C:
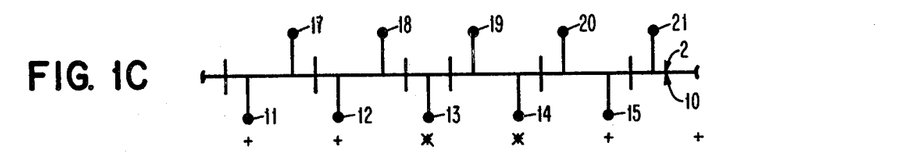
Figure 1D:
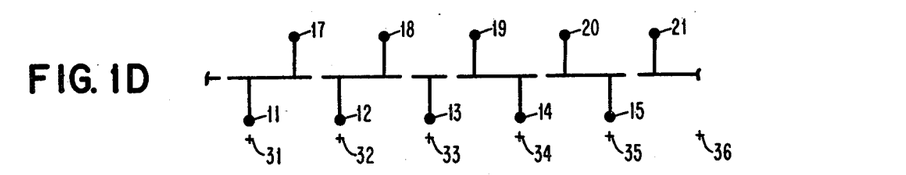

In FIG. 1A two groups of contacts, 11 through 15 and 17 through 20, are interconnected via conductive line pattern 1 which consists of conductive line 2 with branch lines 3 projecting from it. The aim of the process using the described arrangement is to provide between pairs of contacts 11 and 17, 12 and 18, 14 and 19, and 15 and 20 separate isolated connections, i.e. to provide conductive segments which interconnect only two respective contacts, and to isolate contact point 13. This is achieved by means of tool 4 schematically represented in FIG. 1B. Parts 5 of tool 4 are aligned along assumed or reference line 10 which in its course is approximately congruent to the course of conductive line 2. Conductive line 2, or assumed line 10, respectively, should have an approximately constant curvature, i.e. both should either be straight or form an arc. The congruence between conductive line 2 and assumed line 10, and the constancy of the curvature of conductive line 2 becomes more critical as the vertical dimensions of elements 5 of the tool are decreased. The mean distance between adjacent branch lines 3 equals a constant value d, and between adjacent parts of a tool it equals 2d, with the exception of two adjacent parts of a tool the distance of which equals approximately d. The deviation of the individual distances from 2d or d, respectively, depends on the width of branch lines 3, the dimension of parts 5 of the tool in the direction of assumed line 10, and, with respect to the distance d between adjacent branch lines of conductive pattern 1, on how precisely the distance 2d between the parts of the tool is maintained, or, with respect to the distance 2d or d of adjacent parts 5 of the tool on how precisely distance d between branch lines 3 of conductive pattern 1 is maintained. When carrying out the process described, and in order to isolate contact 13, tool 4 is aligned to conductive line 2 in such a manner (see FIG. 1C) that assumed line 10 coincides with conductive line 2, and the two adjacent parts 5 of the tool for which the distance between them is d are approximately symmetrical to the branch line of contact 13. Alignment can also be performed using fiducial points. Fiducial points 31 to 36 may be provided on the substrate along with conductive pattern 1 which are aligned with respect to the branch-offs to contacts 11 to 15 on an imaginary line that is parallel to conductive line 2. The distance between adjacent fiducial points is 2d, approximately. The tool includes the two fiducial points 51 and 52 which are on an assumed line parallel to assumed line 10, at the same distance from assumed line 10 as fiducial points 31 to 36 are from conductive line 2. The distance between fiducial points 51 and 52 is the same as that between adjacent fiducial points of the conductive line pattern. Fiducial point 51 is aligned to be mid-way between the closely adjacent parts of the tool which are spaced apart the distance d. After aligning, each part 5 of the tool executes a separation of conductive line 2. The result is shown in FIG. 1D. The process applied in providing the separation depends on the tool selected. Conductive line patterns of metal wire and thicker patterns applied on a substrate can be interrupted by a tool whose parts 5 consist of mechanical cutting devices or of such elements which cause the melting of the conductive line material, such as micro-welding torches, lasers or electron beams. However, if heat is applied to achieve separation, a given substrate has to resist the temperatures involved. For microminiaturized conductive circuit line patterns, lithographic methods are particularly applicable for separating the conductive lines. Further reference to these methods is made below in connection with specific embodiments. It will be recognized that by placing the tool such that the distance d is centered about another contact, for example contact 12, that that contact can be isolated as opposed to contact 13. Thus contact 13 can be isolated and contacts 13 and 18 will be connected together.

Figures 2A, 2B:
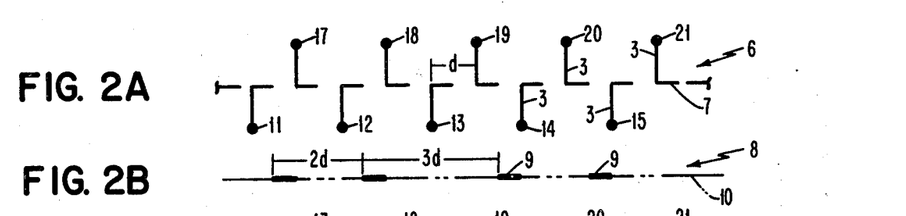
FIGS. 2A to 2D are a schematic representation of the making of selected conductive connections between respective contacts, initially all isolated from each other, and excluding one contact in accordance with the invention, in that, as shown by FIG. 2C, the tool of FIG. 2B is aligned over the conductive line extending horizontally in the conductive line pattern of FIG. 2A, and that subsequently into the conductive line in several places missing conductive line parts are inserted so that the pattern of FIG. 2D is formed.
Figure 2C:
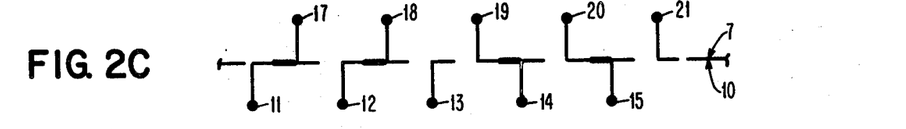
Figure 2D:
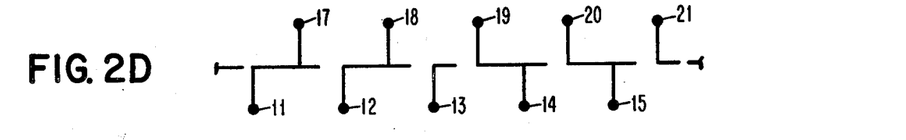

It will now be explained in connection with FIGS. 2A to 2D how individual connections between contacts 11 and 17, 12 and 18, 14 and 19, and 15 and 20 can be made by the addition of missing conductive line pieces to the conductive line 7 of conductive line pattern 6. The isolated line connected to contact 13 is not changed thereby. Conductive line pattern 6 shown in FIG. 2A differs from conductive line pattern 1 of FIG. 1A in that conductive line 7 has interruptions between the branch-offs spaced at an approximately constant distance d from each other. The absolute value of d being, of course, variable from one conductive line pattern to the next one. Tool 8 of FIG. 2B differs in its dimensions from tool 4 of FIG. 1B in that the distance between the two unequally spaced adjacent parts of the tool is not d but 3d, while the remainder of the marks are spaced from each other by 2d. Since they execute different functions, the parts of the tool of FIG. 2B have, of course, to be different from the parts of the tool of FIG. 1B. Other characteristics, with respect to the design of conductive line patterns and tools, and with respect to the aligning of tool 8 over conductive line pattern 6 with or without the use of fiducial points, are the same as the specifications already given in connection with FIGS. 1A to 1D. Conductive line 7 and assumed line 10 of tool 8 are aligned one above the other, and the two parts of the tool whose distance from each other is 3d are symmetrical to the line connected to contact 13, as shown in FIG. 2C. Subsequently, those pieces of conductive line 7 which are missing in the area of the parts of the tool are inserted. The result is shown in FIG. 2D. The process applied to provide the connection depends on the tool selected. For conductive line patterns made of wires, or for samples of conductive line patterns applied on the substrates, tools are suitable which fill the spaces between the pieces of conductive line 7 for instance with a solderable material. As in the previous case, if higher temperatures have to be applied, it is necessary for the substrates to resist the temperatures applied. Less risky for conductive line patterns applied on the substrates, and also suitable for microminiaturized conductive line patterns, are those processes where the missing conductive line pieces are inserted lithographically. Further reference in detail is made thereto below in more specific embodiments.

Shown in FIGS. 3A to 3D and 4A to 4D are two examples which show that the process described can also be applied when more than one contact is to be isolated, or when one contact in a conductive line pattern is to be isolated and separate connections between three respective contacts are furthermore to be made. In both examples the separate connections are established, and contacts are isolated, in accordance with the process described in FIGS. 1A to 1D. Conductive lines are interrupted by means of suitable tools positioned in predetermined positions. It is, however, pointed out that in both examples the separate connections can also be made when one starts with conductive line patterns having interruptions in the conductive lines, and when missing pieces of the conductive line are then inserted by means of suitable tools, in accordance with the process described in connection with FIGS. 2A to 2D.

With the process described in connection with FIGS. 3A to 3D contacts 11 and 17, 14 and 18, and 15 and 19 are to be interconnected by separate lines, and contacts 12 and 13 are to be isolated. In conductive line pattern 22 of FIG. 3A, two conductive lines 23 and 24 are provided which in every respect correspond to conductive line 1 in in FIG. 1A. As shown, only each second line 3 branching off from conductive lines 23 and 24 is directly connected to a contact whereas the other lines 3 establish connections between conductive lines 23 and 24. Tools 4 of FIGS. 1B and 3D are identically designed. For making the separate lines, tool 4 is first aligned to one of the two conductive lines 23 and 24. It is for instance first aligned to conductive line 24. Assumed line 10 of tool 4 is then made to coincide with conductive line 24, subsequently the tool is shifted along this conductive line in such a manner that the two parts of the tool which show the distance d from each other, are symmetrical to the branch-off of the branch line to contact 13. Subsequently, conductive line 24 is severed within the area of parts 5 of the tool. Then, tool 4 is aligned to conductive line 23 in the same manner, with the result that the two parts 5 of the tool whose distance from each other is d, are symmetrical to the branch-offs in the branch lines to contacts 17 and 18. Then, conductive line 23 in the area of parts 5 of the tool is severed. The two positions of the tool to the conductive line pattern in which the severing takes place is shown in FIG. 3C. The result is shown in FIG. 3D. As explained in connection with FIGS. 1A to 1D, fiducial points can also be used for the aligning. For that purpose, two fiducial points are required to each branch-off of a line from conductive lines 23 and 24 to one of contacts 11 to 15, the arrangement of said fiducial points with respect to these branch-offs being exactly as described above in connection with FIG. 1A. Accordingly, two fiducial points are required on tool 4; their arrangement has been discussed in connection with FIG. 1B.

In the above discussed example two contacts, i.e. contacts 12 and 13, are isolated. However, it is equally possible to isolate three or more contacts. This is achieved in that for each further contact to be isolated another conductive line corresponding to conductive lines 23 and 24 is provided. Thus a network is formed within the conductive line pattern which consists of conductive lines corresponding to conductive lines 23 and 24, and of connections between these conductive lines. From the two outer conductive lines of this network each second branch-off line directly leads to a contact, whereas the remaining branch-off lines lead to the adjacent conductive lines. From the conductive lines inside the network all branch lines alternatingly branch off to the two adjacent conductive lines. For making the separate connections and the isolation of the predetermined contacts it can be easily determined, by means of simple considerations, how to align tool 4 to the conductive lines, by means of the process of FIG. 3C, so that the severing of the conductive lines by the parts of the tool occur in their correct positions.

Figures 3A, 3B:
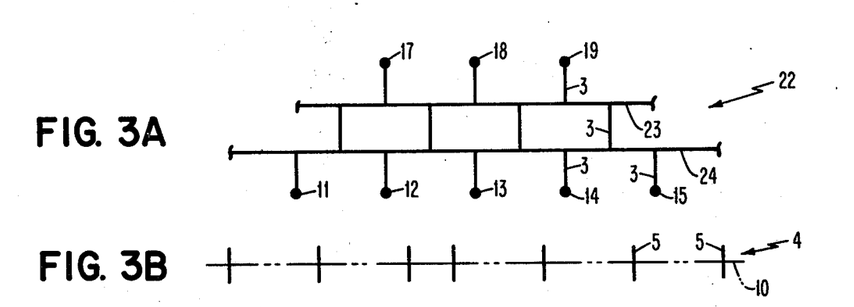
FIGS. 3A to 3D are a schematic representation of the making of selective conductive connections between pairs of two respective contacts, including the isolation of two contacts in accordance with the invention in that, as shown by FIG. 3C, in two successive process steps the tool of FIG. 3B is successively aligned over the conductive lines extending horizontally in the conductive line pattern of FIG. 3A, and that subsequently the conductive lines are repeatedly interrupted so that the pattern of FIG. 3D is formed.
Figure 3C:
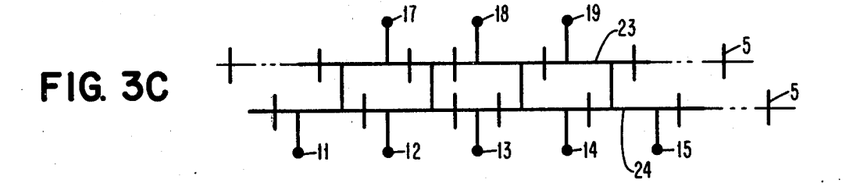
Figure 3D:
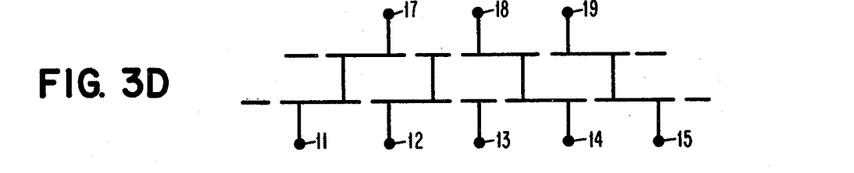

In FIG. 3A, conductive lines 23 and 24 have the same curvature, and all branch-offs are constantly spaced from their adjacent branch-offs. It is therefore possible to carry out the required severings with a tool 4. If for some reason it should be desirable that the distances between the branch-offs from conductive line 23 are different from the distances between the branch-offs of conductive line 24, or that the conductive lines have a different curvature, the process described is still applicable but a specific tool has to be provided for each conductive line. The same consideration applies when more than two conductive lines differing from each other are provided in the conductive line pattern.

Figure 4A:
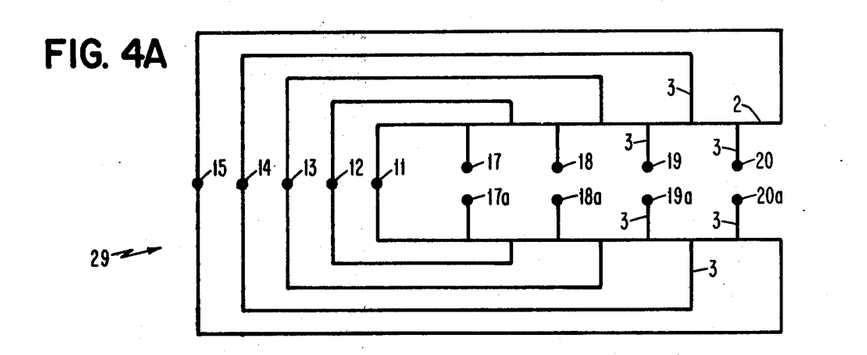
FIGS. 4A to 4D are a schematic representation of the making of selective conductive connections in accordance with the invention, between three respective contacts, including the isolation of one contact in that, as shown by FIG. 4C, the tool of FIG. 4B is aligned over the conductive lines extending horizontally in the conductive line pattern of FIG. 4A, and that subsequently the conductive lines are interrupted in several places, so that the pattern of FIG. 4D is formed.
Figure 4B:
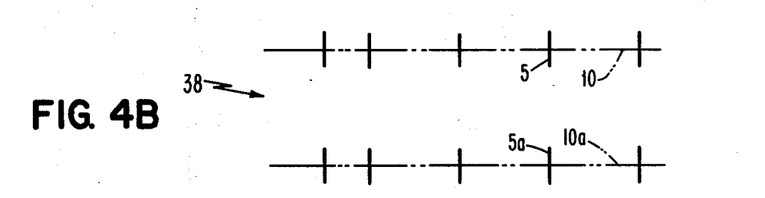
Figure 4C:
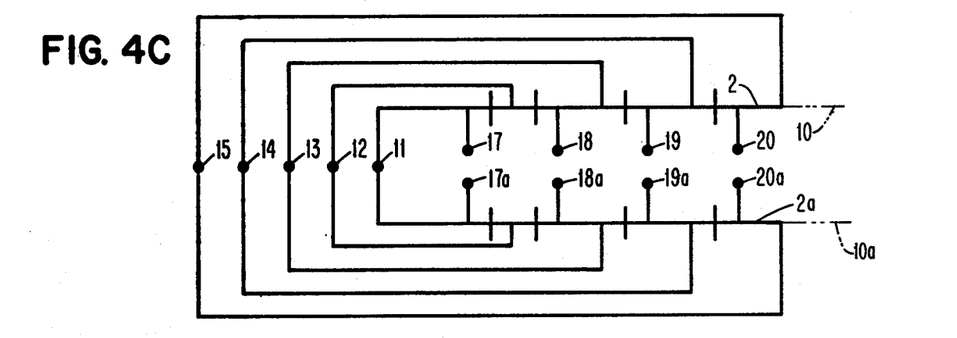
Figure 4D:
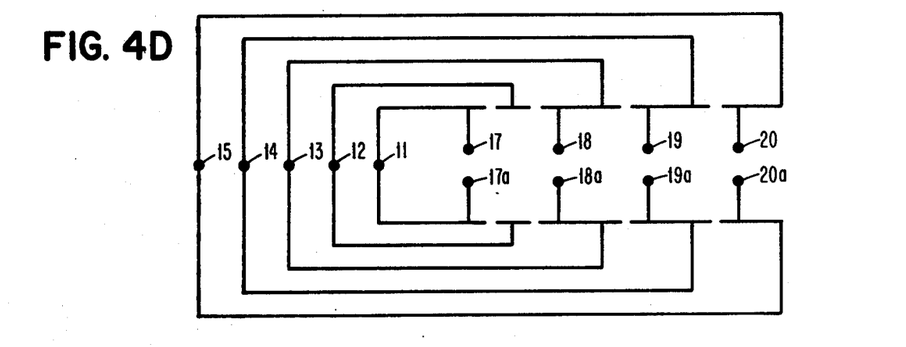

FIGS. 4A to 4B illustrate how separate connections between a first set of contacts and two respective other sets contacts are established, and how one contact may be isolated. In the example, contacts 11 and 13 to 15 are to be connected to contacts 17 and 17a, 18 and 18a, 19 and 19a, and 20 and 20a, respectively, whereas contact 12 is to be isolated. In conductive line pattern 29 shown in FIG. 4A, two parallel straight conductive lines 2 and 2a are provided which are of the same design as conductive line 2 of FIG. 1A, and where the distance between the branch-offs is approximately constant. Some of the contacts, i.e. those with the numbers 11 to 15, are directly connected each to both conductive lines 2 and 2a. The other contacts, i.e. those with the numbers 17 to 20 and 17a to 20a, are directly connected each of one of the conductive lines 2 and 2a only. From conductive lines 2 and 2a lines lead alternatingly to contacts 11 to 15 which are directly connected to both conductive lines, and to contacts 17 to 20, and to 17a to 20a which are directly connected each to one conductive line only. The two branch-offs belonging to a contact connected to both conductive lines are each approximately on the same straight line vertically intersecting the conductive lines. In FIG. 4B, tool 38 is represented schematically. It consists of two rows of parts 5 and 5a of the tool which are arranged along assumed lines 10 and 10a. It will be understood that the spacing of the parts 5 and 5a of the tool can be altered such that the smaller of the two distances between parts appears other than at the extreme left of the tool. Consideration should be given to the horizontal spacing between contacts 17, and 17a, and contact 11, if additional parts 5 and 5a are provided to the left of the smaller spaced parts in order not to sever the line between contacts 11 and 17 and 11 and 17a. Assumed lines 10 and 10a extend approximately the same distance from each other as lines 2 and 2a. Apart from two respective adjacent parts of the tool, the parts of the tool have an approximately constant distance from the adjacent parts of the tool, said distance being approximately equal to twice the distance between the branch-offs from the conductive lines, whereas the closer spaced parts of the tool have approximately the same distance from each other as the branch-offs. Each part of the tool in one row has as its exact opposite a part of the tool in the other row. Tool 38 corresponds furthermore to tool 4 discussed in connection with FIG. 1B. For making the separate lines tool 38, as a shown in FIG. 4C, is aligned to conductive line pattern 29 in such a manner that assumed line 10 coincides with conductive line 2, and assumed line 10a coincides with conductive line 2a, and that the parts of the tool which show the smaller distance from each other are symmetrical to the branch-offs leading to contact 12. Subsequently, the conductive lines are interrupted in the area of the parts of the tool. The result is shown in FIG. 4D.

The process described with FIGS. 4A to 4D can also be applied when the two rows of branch-offs from the two conductive lines are not exactly opposite each other but are shifted with respect to each other to a predetermined extent. In that case, the two rows of the parts of the tool merely have to be shifted to the same amount and in the same direction, with respect to each other. It is also possible that the two conductive lines and accordingly the rows of parts of the tool are not straight-lined but that they form concentric circular arcs, or that they are arranged on such circular arcs. In that case, however, the radius of the circular arcs has to be considered when determining the distances between the branch-offs and the parts of the tool.

Separate connections of a contact with two respective other contacts could be provided also in those cases where in FIG. 4A conductive lines 2 and 2a would differ in the curvature or in the distances between the branch-offs. However, it would then be impossible to use one tool as shown in FIG. 4B, but two tools would have to be applied that fit to conductive lines 2 and 2a.

The invention will now be discussed in more detail by means of specific embodiments. In all embodiments, the conductive line pattern is applied on structures which contain semiconductor circuits. The semiconductor circuits are covered by at least one passivation layer. Under the top passivation layer there can be one or more metallization layers. Into the top passivation layer, for example silicon dioxide, contact holes are etched in those places where a conductive contact is to be established with parts of a circuit under the top passivation layer. In all embodiments, the semiconductor circuits had previously been tested and one respective—surplus—part of the circuit having been determined which is not to be included in the conductive line pattern. The conductive line patterns to be applied are designed either like the conductive line pattern of FIG. 1A, or like the conductive line pattern of FIG. 2A. In all examples, the separate connections are made by means of lithographic processes, with irradiation by light. It would, of course, also be possible to use X-ray or electron beam irradiation. Either positive photoresists, which change into a soluble form upon exposure, or negative photoresists, which change into an insoluble form upon exposure, may be used. The tools applied are exposure masks. The masks show either the structure shown in FIG. 1B, or that shown in FIG. 2B. The parts of the tool consist either of non-transparent areas in an otherwise transparent plate (positive), or of transparent areas in an otherwise non-transparent plate (negative).

EXAMPLE I

Assuming the circuit corresponding to contact 13 is determined to be surplus after testing. An aluminum conductive line pattern corresponding to FIG. 1A is applied on the passivation layer, contacts 11 to 15 and 17 to 21 aligning with holes in the passivation layer to provide contact to metallization layers of underlying separate circuits. Onto this structure, a photoresist layer is spin-coated onto the entire surface. Subsequently, in one of the standard exposure machines, a mask representing the negative of FIG. 1B, provided a positive photoresist has been used, or the positive of FIG. 1B, provided a negative photoresist has been used, is aligned over the conductive line pattern in such a manner that the assumed line 10 coincides with conductive line 2, and that the two parts 5 of the tool having a distance d from each other are symmetrical to the branch-off to contact 13. Subsequently, the exposure through the mask takes place. Then, development is performed, i.e. for a positive photoresist consisting of an n-cresol formaldehyde novolak resin development is accomplished with an aqueous alkaline solution, or for a negative photoresist consisting of a cyclized poly-cis-isoprene development is accomplished with a xylene-isopropyl-alcohol mixture. In the next step, the aluminum not covered by the photoresist is etched off. Finally, the rest of the photoresist is removed and there remains the conductive line pattern shown in FIG. 1D. Thus the surplus circuit associated with the contact 13, of the set of similar circuits associated with the contacts 11 to 15, has been eliminated, while the remainder of the circuits associated with contacts 11, 12, 14 and 15 have been connected to the set of similar circuits associated with the contacts 17 to 20.

EXAMPLE II

Again, assuming the circuit associated with contact 13 is tested to be surplus. Beginning with a structure which differs from that of Example I in that a conductive line pattern is applied which corresponds to that of FIG. 2A, the same process as in Example I is applied up to the developing of the photoresist. An exposure mask representation of the sturcture of FIG. 2B is used. The mask shows the negative of FIG. 2B when a positive photoresist is used, and the positive of FIG. 2B when a negative photoresist is used. After developing a 1 micron thick aluminum layer, for example, is vapor-deposited on the entire surface. Subsequently, the remaining photoresist and the aluminum on the photoresist are removed. There remains on the structure a conductive line pattern which corresponds to FIG. 2D and which is substantially identical with the conductive line pattern of Example I.

EXAMPLE III

The starting element is a support covered on the entire surface with vapor-deposited aluminum. This structure is fully covered with a positive photoresist layer. In a conventional exposure machine a first mask is subsequently aligned in a conventional manner, i.e. using fiducial points on the support and on the mask, which mask represents the positive image of the structure of FIG. 1A, in other words, the structure on the mask appears non-transparent. In the following step, the first mask is exchanged with a second mask representing the negative of the structure shown in FIG. 1B. This mask is brought into the same position with respect to the conductive line pattern latently existing in the photoresist layer after the first exposure, as shown in Example I. However, as the latent image existing in the photoresist of the conductive line pattern is not visible, it is necessary to provide on the mask two fiducial points, and to provide on the support for each possible operating position of the mask with respect to the latent conductive line pattern, two respective fiducial points. The manner of positioning the fiducial points on the mask and on the substrate has been discussed above. After the second exposure the photoresist layer is developed, then the aluminum not covered by the photoresist is etched off, and finally the remaining photoresist is removed. On the support there remains the structure represented in FIG. 1D.

EXAMPLE IV

Using the structure of Example III, the process of Example III can also be executed in that a layer with negative photoresist is applied and that it is first exposed through a first mask representing the negative of the structure of FIG. 2A, and that it is then exposed with a second mask which shows the negative of the structure of FIG. 2B. If the process is carried out in this manner, there remains after the removal of the photoresist the conductive line pattern of FIG. 2D on the support.

EXAMPLE V

In the first step, the structure without conductive line material is covered with a layer of negative photoresist. In a conventional exposure machine a first mask is subsequently aligned conventionally with respect to the structure, said mask showing the positive of the structure of FIG. 1A. Through this mask the exposure is subsequently carried out. With respect to that conductive line pattern latently existing in the photoresist layer, a second mask serving as a tool and representing the negative of the structure of FIG. 1B is aligned by means of fiducial points on the mask and on the structure, in such a manner that the second mask has the same position with respect to the latent conductive line pattern as in Example I. Subsequently, a second exposure takes place after which the photoresist layer is developed. At that stage the photoresist layer shows the negative of the conductive line pattern of FIG. 1D. Now, aluminum is vapor-deposited on the entire surface, and subsequently the remaining photoresist and also the aluminum thereon is removed. There remains on the structure the positive image of the aluminum conductive line pattern shown in FIG. 1D.

EXAMPLE VI

Using the same structure as in Example V, the process of Example V can also be carried out when in the first step a covering layer of positive photoresist is deposited over the support. When this layer is exposed through a first mask representing the negative of the conductive line pattern of FIG. 2A, and then through a second mask serving as a tool and representing the negative of the conductive line pattern of FIG. 2B. There remains, after aluminum is vapor-deposited on the structure, a conductive line pattern of aluminum which is identical with the conductive line pattern shown in FIG. 2D.

Those skilled in the art will recognize that the exact length and shape of the branch lines 3 are of little importance as the separation or joining of the conductive line pattern is achieved with respect to points disposed along the conductive line of constant curvature, for example line 2 in FIG. 1A. That is, contacts 17 to 21 and 11 to 15 could also have been placed along the path line 2 itself, provided that sufficient space would then be available for interrupting or bridging conductive line 2.

While the invention has been particularly shown and described with reference to the preferred embodiments, it will be recognized by those skilled in the art that the foregoing and other changes in form and details may be made therein without departing from the spirit and scope of the invention.

What is claimed is:

1. The method for interconnecting n pairs of contacts between a first group of n contacts and n contacts of a second group of at least n+1 contacts on a substrate, where n is a positive integer, comprising the steps of:
    disposing a first set of n and a second set of n+1 points alternatingly along at least one path of constant curvature, each of said points in said sets being associated with a different one of said contacts in said first and second groups of contacts, said points being disposed a distance d from each other along said path;
    providing a tool comprising two adjacent sets of parts arranged along at least one line having the same constant curvature as said path, the parts of each set of parts being distributed along said line by a distance 2d within sets and the spacing of adjacent parts between said sets of parts being spaced apart a distance which differs by about one half of the distance 2d between parts of the same set;
    positioning said tool to provide alignment between said line and said path and aligning said parts with said points such that said adjacent parts between said sets of parts are substantially symmetrically aligned with one of said second set of points positioned between said parts; and
    simultaneously providing at least the image of isolated conductive connections between pairs of contacts associated with each of said n contacts of said first group of contacts and n of the remaining contacts of said second group of n+1 contacts, the contact associated with said one of said second set of points positioned between said parts being isolated.

2. The method of claim 1 wherein said path of constant curvature comprises at least the image of a continuous conductive path interconnecting all of said points and further that said tool provides said isolated conductive connections between said pairs of contacts by interrupting said continuous conductive path.

3. The method of claim 2 wherein said continuous conductive path further comprises a second continuous conductive path parallel to said first path interconnected by conductive branch lines to said first conductive path, and wherein a second positioning step is effected to provide alignment between said line and said second path such that said adjacent parts are substantially symmetrically aligned between two of said points of said first set of points and spaced along said second path a distance of one-half d from said first alignment position.

4. The method of claim 1 wherein said path of constant curvature comprises at least the image of a discontinuous conductive line having a plurality of segments, each coupled to one of said contacts, and further wherein said tool provides said isolated connections by bridging adjacent segments of said discontinuous line.

5. The method of claim 1 wherein said contact containing substrate is covered with a layer of undeveloped photo-sensitive material and wherein said tool comprises a photomask and said parts of said tool comprise image defining regions having different transparency to radiation than the remainder of said photomask.

6. The method of claim 5 wherein said photo-sensitive material is irradiated through said tool, the design of which is determined by the nature of the photo-sensitive material and by the design of the path of constant curvature and wherein said isolated connections are established after said photo-sensitive material is irradiated and developed such that when, during development, conductive line material is exposed, said conductive line material is etched off of said substrate and when said substrate is exposed during development a conductive line material is then vapor deposited and thereafter said remaining photo-sensitive material and overlying conductive line material is removed.

7. The method of claim 5 wherein said contacts are supported by a substrate wherein at least one conductive line having interruptions therein between said points is provided and wherein said photo-sensitive material is irradiated through said photomask which is adapted to the photosensitive material in such a manner that photo-sensitive material areas over at least some of said interruptions are soluble after irradiation.

8. The method of claim 5 wherein said contacts are supported by a substrate having a conductive line thereon connecting said contacts and wherein said photo-sensitive material is irradiated through said photomask which is adapted to said photo-sensitive material in such a manner that in those areas where interruptions are to be made in said conductive line, the photo-sensitive material over said areas is soluble after irradiation.

9. The method of claim 5 wherein said path of constant curvature is disposed only as a continuous latent image in a layer of negative photo-sensitive material through use of a first mask representing said path as regions not transparent to radiation and said tool comprises a second mask wherein said parts comprise areas of said second mask which are radiation transparent.

10. The method of claim 5 wherein said path of constant curvature is disposed only as a continuous latent image in a layer of positive photo-sensitive material through the use of a first mask representing said path as regions not transparent to irradiation and said tool comprises a second mask wherein said parts comprise radiation transparent areas.

11. The method of claim 5 wherein said path of constant curvature is disposed only as an interrupted latent image in a layer of positive photo-sensitive material through the use of a first mask representing said path as radiation transparent areas, and said tool comprises a second mask wherein said parts comprise areas which are radiation transparent.

12. The method of claim 5 further including a continuous conductive layer on said substrate under said photo-sensitive material layer and said path of constant curvature is disposed only as an interrupted latent image in a material through the use of a first mask representing said path as radiation transparent areas, and said tool comprises a second mask wherein said parts comprise areas of said second mask which are radiation transparent.

* * * * *

UNITED STATES PATENT AND TRADEMARK OFFICE
CERTIFICATE OF CORRECTION

PATENT NO. : 4,158,072

DATED : June 12, 1979

INVENTOR(S) : Armin Bohg, Marian Briska and Bernd Garben

It is certified that error appears in the above–identified patent and that said Letters Patent are hereby corrected as shown below:

Column 14, Claim 12, line 17, after "in a" insert --layer of negative photo-sensitive--.

Signed and Sealed this

Fourth Day of December 1979

[SEAL]

Attest:

SIDNEY A. DIAMOND

Attesting Officer

Commissioner of Patents and Trademarks